United States Patent
Carpenter, Jr. et al.

(10) Patent No.: US 6,469,884 B1
(45) Date of Patent: Oct. 22, 2002

(54) INTERNAL PROTECTION CIRCUIT AND METHOD FOR ON CHIP PROGRAMMABLE POLY FUSES

(75) Inventors: John H. Carpenter, Jr., Rowlett, TX (US); Joseph A. Devore, Richardson, TX (US); Reed Adams, Plano, TX (US); Ross Teggatz, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/472,710

(22) Filed: Dec. 24, 1999

(51) Int. Cl.$^7$ ............................................... H02H 3/22

(52) U.S. Cl. ........................... 361/111; 361/104; 365/7; 327/525

(58) Field of Search ................................. 361/103, 104, 361/111; 365/225.7, 96; 327/525; 257/529, 530, 50; 337/518, 158

(56) References Cited

U.S. PATENT DOCUMENTS

| | | | | |
|---|---|---|---|---|
| 4,446,534 A | * | 5/1984 | Smith | 327/525 |
| 4,823,320 A | * | 4/1989 | Smayling et al. | 365/185.1 |
| 5,663,902 A | * | 9/1997 | Bennett et al. | 365/96 |
| 6,028,756 A | * | 2/2000 | Freyman et al. | 257/774 |

* cited by examiner

*Primary Examiner*—Kim Huynh
(74) *Attorney, Agent, or Firm*—Alan K. Stewart; W. James Brady, III; Frederick J. Telecky, Jr.

(57) ABSTRACT

An integrated circuit (10) having at least one programmable fuse (F1) and ESD circuitry ($MN_3$, $MN_1$) preventing the fuse (F1) from being unintentionally blown when a voltage transient exists on a main voltage potential ($V_{main}$). The ESD circuitry preferably comprises of MOSFET switches which are coupled to turn on quicker than a main fuse programming switch ($MN_{main}$) due to the voltage transient, thereby insuring that the main switch remains off during the voltage transient to prevent the unintentional blowing of the fuse F1. The circuit is well suited for programmable logic device (PLDs), allowing for read voltages as low as 6 volts, and allowing for programming voltages as high as 40 volts.

16 Claims, 2 Drawing Sheets

INTERNAL PROTECTION CIRCUIT AND METHOD FOR ON CHIP PROGRAMMABLE POLY FUSES

FIELD OF THE INVENTION

The present invention is generally related to integrated circuit (IC) devices having programmable polysilicon fuses such as programmable logic devices (PLDs), and more particularly to internal ESD protection circuits for the on chip programmable polysilicon fuses.

BACKGROUND OF THE INVENTION

Integrated circuit devices typically comprise electrical components being fabricated upon a wafer substrate through a series of semiconductor processes. One such type of IC device incorporates multiple programmable polysilicon fuses that can be selectively blown i.e. rendered an open circuit, to establish an operative circuit that is configured as a function of the states of the polysilicon fuses.

These IC devices are often powered by at least one voltage supply, and usually have a second input voltage control pin adapted to receive a high voltage signal during a programming mode, which may exceed 40 volts direct current (DC) in a conventional implementation. Most programmable integrated circuits have the ability to allow for the electronic reading of the polysilicon fuse states by providing a read signal, such as a voltage to a read input, allowing one to ascertain the state of the polysilicon fuses and thus the configuration of the circuit.

One primary problem with most conventional schemes is the need to read the polysilicon fuse states using a low voltage signal down to as low as about 6 volts DC. Most conventional circuits need enough voltage headroom to work which hampers the ability to reliability read the state of the fuses. A second problem is the need to operate under "high voltage" conditions, which can raise the power supply rail to at least 40 volts.

There are not many prior art polysilicon fuse programming circuits that need to work over such extreme voltages. One known solution uses long channel MOSFET devices providing a relatively constant pull down current to programming switch devices. The long channel MOSFET is added from switches gate to ground. However, these devices pull-down voltages to operating circuitry all the time, whereby this constant pull-down voltages reduces the speed at which switches used to blow the polysilicon fuses is reduced. Moreover, these pull-down circuits often can not discharge the gate of MOSFETS fast enough during a transient to the operating voltage supply, which consequently allows possible damaging the polysilicon fuses or accidently blowing the fuses, and perhaps rendering the integrated circuit in an unintentional or inoperable circuit configuration.

Integrated circuits are often provided with electrostatic discharge (ESD) circuitry adapted to respond to transient voltages i.e. voltage spikes on the supply voltages provided to the IC circuit. However, prior art solutions for programmable IC devices, such as programmable logic devices (PLDs) are often times inadequate and slow, or, are not adapted to operate over extreme voltage ranges.

What is desired is an integrated circuit having programmable fuses that has an ESD circuit to prevent damage to the on-die fuses, but still allows the on-die programming mode to work, eliminating the chance of damaging the on-die fuse, such as a polysilicon fuse. Such circuitry would be adapted to allow reading the state of the fuses down to about 6 volts, but which is also adapted to operate at power supply voltages of up to 40 volts.

SUMMARY OF THE INVENTION

The present invention achieves technical advantages as an electrostatic discharge (ESD) circuit adapted to disable programming circuitry for on-die fuses upon the detection of a voltage transient on a voltage supply operating the integrated circuit. The present invention achieves technical advantages by quickly determining a voltage transient i.e. voltage spike on the voltage supply, and quickly turning off programming circuitry before fuses coupled thereto can be damaged or inadvertently blown. The present invention achieves this function by providing for an ultra-fast switch that maintains programming switching off in response to detecting the voltage transient on the voltage supply.

According to a first embodiment, the present invention comprises an ESD circuit comprising a fuse coupled to a voltage potential. A control device is coupled to the fuse, and is adapted to selectively blow the fuse in response to a first control signal. The protection circuit is provided and coupled to the control device and is adapted to responsively disable the control device in response to a voltage transient residing on the voltage potential. The control device preferably comprises a first switch that is susceptible to being momentarily turned on when the voltage transient resides on the voltage potential without the protection circuit. The first and second switch both preferably comprise a MOSFET device.

The protection circuit preferably comprises a second switch being coupled to the voltage potential, where advantageously, the second switch is adapted to turn on quicker than the first switch to maintain the first switch off, preventing any fuses from being blown during the transient on the voltage supply. The second switch preferably comprises a MOSFET having a gate, source and drain, further comprising a capacitor coupled across the gate and drain and coupled to the voltage potential. This capacitor capacitively couples more charge to the second switch than the charge coupled to the first switch, this capacitor having more capacitance than the parasitic capacitance inherently defined across the MOSFET of the programming circuit. According to the present invention, there is provided a third switch responsively coupled to the second switch and controllable coupled to the first switch. In the preferred embodiment, the fuses comprise of polysilicon fuses, but can be comprised of other materials as desired and suitable for the particular implementation.

The circuit further preferably comprises a read circuit coupled to the fuse and adapted to read a state of the fuse in response to a read control signal. This read circuit comprises a fourth switch coupled between the fuse and a read output node. At least one zener diode, is preferably coupled between the second switch and ground to protect a gate oxide of the second switch forming a portion of the protection circuit. The ESD device is adapted to operate at a voltage potential being between 6 volts and 40 volts, allowing the state of the fuses to be read at voltages as low as 6 volts, while allowing programming voltages of up to 40 volts.

According to a second embodiment of the present invention, there is provided a method of operating an integrated circuit (IC) device having an ESD circuit protecting a programmable fuse coupled to a voltage potential on an IC device. The IC device has a programming circuit coupled to the fuse for selectively blowing the fuse. The method comprises the step of responsively disabling the programming circuit in response to detecting a voltage transient on the voltage potential. The method further comprises the programming circuit having a first switch coupled to the voltage potential which is susceptible to momentarily turning on in response to the voltage transient on the voltage potential, further comprising the step of disabling the programming circuit faster than the first switch can turn on in response to the voltage transient. A second switch preferably maintains the first switch off in response to the presence of the voltage transient. The second switch is preferably a MOSFET coupled to the voltage potential, further comprising a capacitor coupled across a gate and drain of the MOSFET an d also coupled to the voltage potential allowing the second switch to turn on quicker than the first switch. The MOSFET switch of the programming circuit and the MOSFET switch of the protection circuit both preferably occupy about the same area on the die of the integrated circuit. The method is adapted to allow operation of the programming circuit at supply voltages of between 6 volts and 40 volts.

DESCRIPTION OF THE PREFERRED EMBODIMENT

Figure 1:
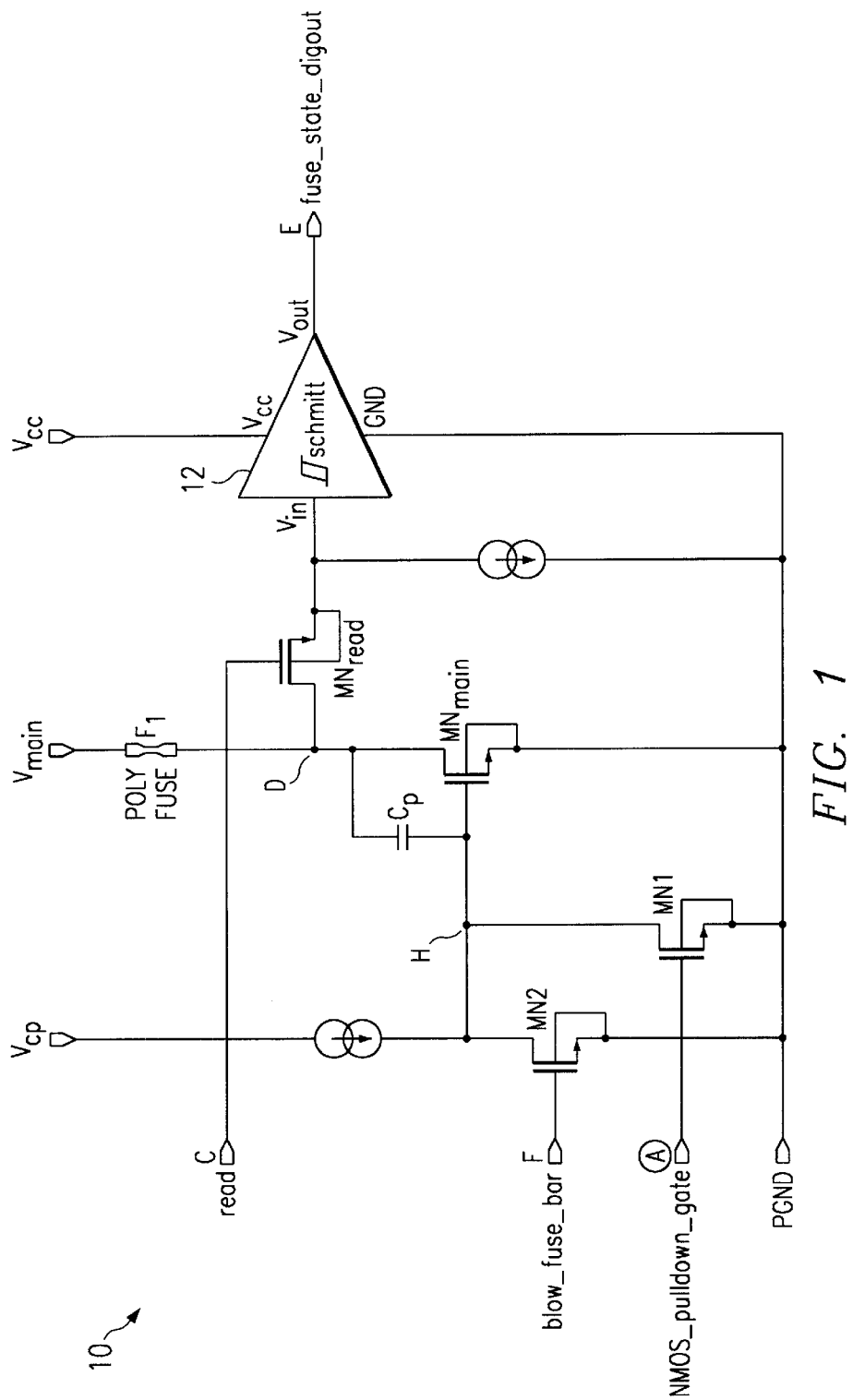
FIG. 1 is a schematic diagram of one portion of the present invention whereby a fuse is seen to be selectively coupled between a voltage potential and ground as a function of a MOSFET $MN_{main}$ which is selectively blown by turning on this switch.
Figure 2:
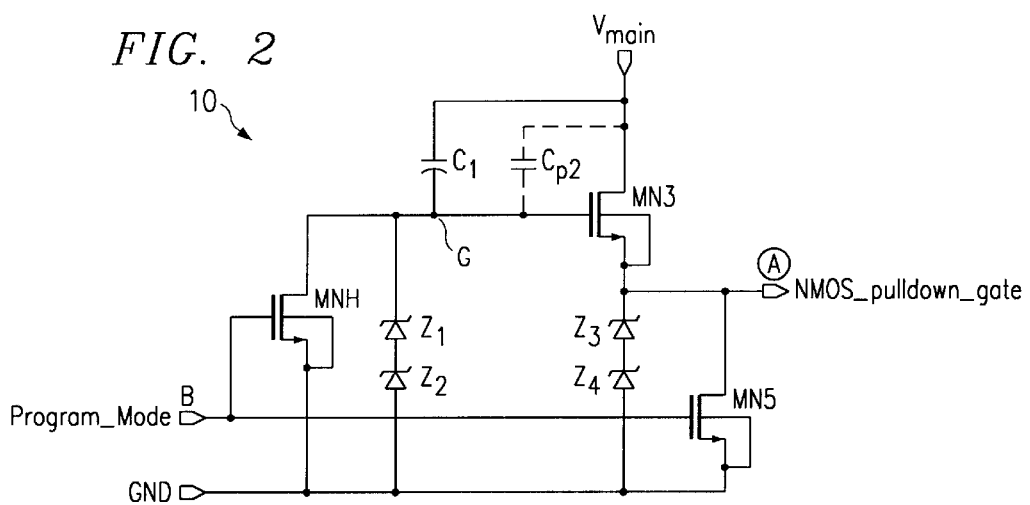
FIG. 2 is a second portion of the overall circuit according to the present invention including additional switches, including a switch $MN_3$ which is adapted to turn on quicker than switch $MN_{main}$.

Referring now to FIG. 1 and FIG. 2, there is illustrated generally at 10 a programmable integrated circuit with a first portion being shown in FIG. 1 and a second portion being shown in FIG. 2.

First with reference to FIG. 1, there is seen a polysilicon fuse F1 coupled between a main voltage supply potential $V_{main}$ and a programming MOSFET switch $MN_{main}$. The MOSFET switch $MN_{main}$ is coupled between the fuse F1 and ground, and is adapted to conduct current and selectively blow the polysilicon fuse F1 upon a logic high being provided to the gate of the enable switch $MN_{main}$. To appreciate the present invention, it needs to be pointed out that a parasitic capacitance shown as Cp exists between the drain and gate of the main switch $MN_{main}$, which could inadvertently turn on due to a sudden voltage transient such as a spike on voltage which could inadvertently turn on due to a sudden voltage transient such as a spike on voltage potential $V_{main}$ capacitively coupling to the gate of the switch if the present invention were not incorporated, portions of which are shown in FIG. 2. Such a sudden voltage transient inadvertently turning on main programming switch $MN_{main}$ could damage and or blow fuse F1 inadvertently, thus rendering the need for the present invention.

Still referring to FIG. 1, and according to the present invention, there is shown another MOSFET switch $MN_1$ which is coupled between the gate of $MN_{main}$, node H, and ground. The gate of switch $MN_1$ is coupled to node A, which is again shown in FIG. 2. Another MOSFET switch $MN_2$ is seen to be coupled between a voltage source $V_{cp}$ and ground, which switch is selectively turned off during programming, allowing for the voltage $V_{cp}$ to be provided for the gate of switch $MN_{main}$ when it is desired to selectively blow the associated polysilicon fuse F1.

Turning now to FIG. 2, according to the present invention, it can be seen that third MOSFET switch $MN_3$ is coupled between the voltage supply potential $V_{main}$ and node A. Advantageously, a capacitor C1 is seen to be coupled across the gate and drain of MOSFET switch $MN_3$, and which may have a capacitance of about 4.75 picofarads (pF) which capacitively couples a voltage transient on the voltage potential $V_{main}$ to the gate of switch $MN_3$. Referring back to FIG. 1, the main MOSFET $MN_{main}$ is preferably, but not necessarily, the same size as the protection switch $MN_3$, and thus has roughly the same parasitic capacitance between the drain and gate. However, switch $MN_3$ is advantageously provided with the capacitor C1 having a capacitance larger than the parasitic capacitance illustrated as $C_p$ or $C_{p2}$ existing between the drain and gate of either of the switches $MN_3$ and $MN_{main}$, respectively. Advantageously, capacitor C1 capacitively couples a voltage transient on the voltage potential $V_{main}$ to the gate of switch $MN_3$ quicker than the voltage transient can be coupled to the gate of switch $MN_{main}$ by parasitic capacitance cp.

A voltage transient on voltage supply $V_{main}$ will capacitively couple to the gate, node G, of switch $MN_3$ enabling the switch to couple the voltage potential of $V_{main}$ to node A, and thus to the gate of switch $MN_1$. This voltage potential at node A, in turn, turns on switch $MN_1$, thus coupling the ground reference shown as PGND to the gate of the main MOSFET switch $MN_{main}$, thus responsively keeping this switch $MN_{main}$ off. Therefore, a transient on $V_{main}$ will not couple from the drain to the gate of the MOSFET $MN_{main}$ and have the chance to unintentionally turn on the switch $MN_{main}$ which may otherwise damage or unintentionally blow the associated polysilicon fuse F1.

Referring back to FIG. 2, a pair of zener diodes $Z_1$ and $Z_2$ are provided between the gate of MOSFET $MN_3$ and ground to protect the gate oxide of switch $MN_3$. Likewise, zener diodes $Z_3$ and $Z_4$ are coupled between node A, and thus the gate of switch $MN_1$, and ground thus also protecting the gate oxide of switch $MN_1$.

A switch $MN_4$ is provided and coupled between the gate of switch $MN_3$ and ground, and has a gate coupled to a node B identified as program mode, which is also coupled to the gate of a switch $MN_5$ being coupled between node A and ground as shown. When it is desired to program the polysilicon fuse F1, and thus turn on the main switch $MN_{main}$, a logic 1, such as a 5 volt potential, is provided to the node B, thereby turning on switches $MN_4$ and $MN_5$ to provide a logic 0 i.e. ground potential to node A, thus turning off switch $MN_1$ and thus allowing the voltage $V_{cp}$ to be provided to the gate of switch $MN_{main}$ to enable switch $MN_{main}$ and thus conduct current to blow the associated polysilicon fuse F1.

Referring back to FIG. 1, there is provided a MOSFET $MN_{read}$ coupled between the polysilicon fuse F1 and a Schmitt fuse detector 12 being powered by a voltage potential $V_{cc}$. Upon providing a logic 1 i.e. 5 volts to node C, switch $MN_{read}$ is enabled and allows for the potential at node D to be passed to the input $V_{in}$ of the Schmitt detector 12. If the fuse F1 is not blown, the voltage potential of $V_{main}$ will be provided to input $V_{in}$. However, if the fuse F1 is blown, a 0 voltage potential at node D will be provided to input $V_{in}$ and detectable at output node E.

Figure 3:
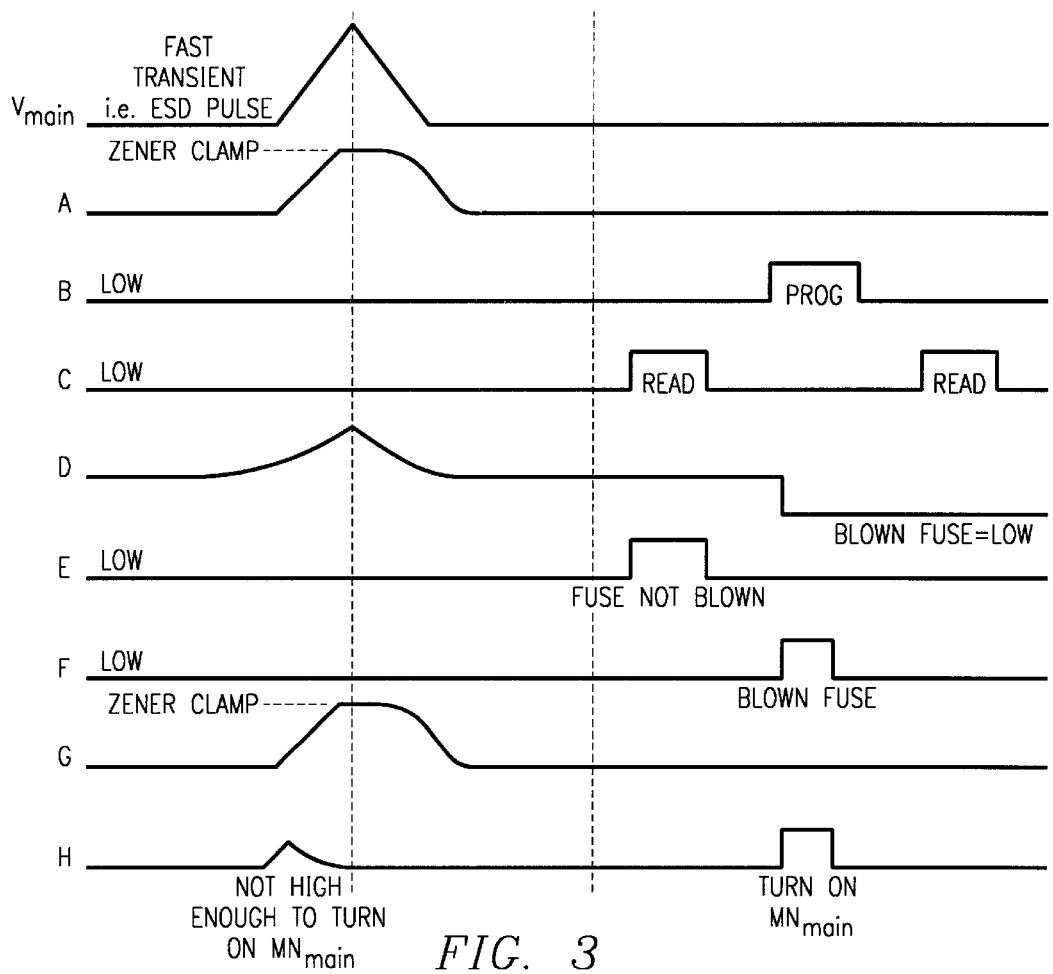
FIG. 3 is a timing diagram illustrating the function and operation of the various switches upon a voltage spike residing on the voltage supply, whereby switch $MN_3$ turns on quickly due to the voltage spike and maintains the programming switch $MN_{main}$ off and thus protecting the associated polysilicon fuse, and also shows normal operation after the spike condition.

Referring now to FIG. 3, there is illustrated a timing diagram at 20 illustrating a voltage spike being provided to the voltage potential $V_{main}$, whereby switch $MN_3$ and switch $MN_2$ responsively momentarily turn on to maintain the switch $MN_{main}$ off, thereby maintaining the voltage at node D in FIG. 1 at a logic high to prevent the unintentional blowing of polysilicon fuse F1. FIG. 3 also illustrates the process of intentionally blowing polysilicon fuse F1 by providing a logic high to node B, thereby turning on switches $MN_4$ and $MN_5$, turning off switch $MN_1$, and allowing main switch $MN_{main}$ to be turned on by maintaining switch $MN_2$ off and allowing the voltage at node D to be coupled to ground, thereby conducting current through polysilicon fuse F1 and thus blowing the fuse. (Inventors, please provide a suitable timing diagram in Figure to illustrate the previous discussion, I just need a rough sketch as an outline for what I need).

Though the invention has been described with respect to a specific preferred embodiment, many variations and modifications will become apparent to those skilled in the art upon reading the present application. It is therefore the intention that the appended claims be interpreted as broadly as possible in view of the prior art to include all such variations and modifications.

We claim:

1. A circuit, comprising:
   a fuse coupled to a voltage potential;
   a control device coupled to said fuse and adapted to selectively blow said fuse in response to a first control signal; and
   a protection circuit coupled to said control device adapted to responsively disable said control device in response to a voltage transient residing on said voltage potential, wherein said control device comprises a first switch susceptible to momentarily turn on when said voltage transient resides on said voltage potential without said protection circuit, and wherein said protection circuit comprises a second switch coupled to said voltage potential, said second switch adapted to turn on quicker than said first switch in response to said voltage transient.

2. The circuit as specified in claim 1 wherein said first switch comprises a MOSFET.

3. The circuit as specified in claim 1 wherein said second switch comprises a MOSFET.

4. The circuit as specified in claim 3 wherein said second switch has a gate, source and drain, further comprising a capacitor coupled across said gate and drain and coupled to said voltage potential.

5. The circuit as specified in claim 3 wherein said first switch comprises a MOSFET and has a parasitic capacitance across its drain and gate, wherein said capacitor has a greater capacitance than said parasitic capacitance.

6. The circuit as specified in claim 1 further comprising a third switch responsively coupled to said second switch and controllably coupled to said first switch.

7. The circuit as specified in claim 1 wherein said fuse comprises a polysilicon fuse.

8. The circuit as specified in claim 1 further comprising a read circuit coupled to said fuse and adapted to read a state of said fuse in response to a read control signal.

9. The circuit as specified in claim 1 further comprising at least one zener diode coupled between said second switch and ground protecting a gate oxide of said second switch.

10. The circuit as specified in claim 1 wherein said ESD device is adapted to operate for said voltage potential being between 6 volts and 40 volts.

11. A method of operating an integrated circuit (IC) device having a circuit protecting a programmable fuse coupled to a voltage potential on said IC device, said IC device having a programming circuit coupled to said fuse for selectively blowing said fuse, comprising the steps of:
   responsively disabling said programming circuit in response to a voltage transient on said voltage potential, wherein said programming circuit has a first switch susceptible to momentarily turning on in response to said voltage transient on said voltage potential, further comprising the step of:
   disabling said programming circuit faster than said first switch can turn on in response to said voltage transient, wherein a second switch maintains said first switch off in response to said voltage transient.

12. The method of operating an integrated circuit as specified in claim 11 wherein said second switch is a MOSFET coupled to said voltage potential, further comprising a capacitor coupled across a gate and drain of said MOSFET and coupled to said voltage potential.

13. The method of operating an integrated circuit as specified in claim 12 wherein said first switch comprises a MOSFET, said first and second switches occupying about the same area on said IC device.

14. The method of operating an integrated circuit as specified in claim 11 wherein said programming circuit is adapted to operate for said voltage potential being between 6 volts and 40 volts.

15. The method of operating an integrated circuit as specified in claim 11 further comprising at least one zener diode protecting said second switch.

16. The method of operating an integrated circuit as specified in claim 11 wherein said fuse comprises polysilicon.

* * * * *